United States Patent
Yu et al.

(10) Patent No.: US 6,762,612 B2
(45) Date of Patent: *Jul. 13, 2004

(54) PROBE CONTACT SYSTEM HAVING PLANARITY ADJUSTMENT MECHANISM

(75) Inventors: David Yu, Bloomingdale, IL (US); Yu Zhou, Vernon Hills, IL (US); Robert Edward Aldaz, Carol Stream, IL (US)

(73) Assignee: Advantest Corp., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/233,935

(22) Filed: Sep. 3, 2002

(65) Prior Publication Data

US 2003/0080763 A1 May 1, 2003

Related U.S. Application Data

(63) Continuation-in-part of application No. 09/885,437, filed on Jun. 20, 2001.

(51) Int. Cl.[7] .............................................. G01R 31/02
(52) U.S. Cl. ...................... 324/757; 324/754; 324/758
(58) Field of Search .............................. 324/158.1, 757, 324/758, 754, 755, 756, 761, 765, 762; 439/141, 331, 14, 18; 73/855, 856; 174/250; 414/716; 438/14, 113, 17, 33, 460

(56) References Cited

U.S. PATENT DOCUMENTS

| | | | | |
|---|---|---|---|---|
| 5,157,325 A | * | 10/1992 | Murphy | 324/158.1 |
| 5,475,317 A | * | 12/1995 | Smith | 324/760 |
| 5,804,983 A | | 9/1998 | Nakajima et al. | |
| 5,861,759 A | | 1/1999 | Bialobrodski et al. | |
| 5,974,662 A | | 11/1999 | Eldridge et al. | |
| 6,043,668 A | | 3/2000 | Carney | |
| 6,305,230 B1 | | 10/2001 | Kasukabe et al. | |
| 6,455,335 B1 | | 9/2002 | Kohno et al. | |

* cited by examiner

Primary Examiner—Kamand Cuneo
Assistant Examiner—Trung Q. Nguyen
(74) Attorney, Agent, or Firm—Muramatsu & Associates

(57) ABSTRACT

A probe contact system is capable of adjusting distances between tips of the contactors and contact targets with simple and low cost mechanism. The probe contact system includes a contact substrate having a large number of contactors, a probe card for fixedly mounting the contact substrate for establishing electrical communication between the contactors and a test system, a stiffener made of rigid material for fixedly mounting and reinforcing the probe card, a probe card ring attached to a frame of the probe contact system for mechanically coupling the probe card to the frame, and a plurality of adjustment members for up/down moving the stiffener relative to the probe card ring at three or more locations so that a gap between the probe card and the probe card ring can be altered.

20 Claims, 12 Drawing Sheets

PROBE CONTACT SYSTEM HAVING PLANARITY ADJUSTMENT MECHANISM

This is a continuation-in-part of U.S. application Ser. No. 09/885,437 filed Jun. 20, 2001.

FIELD OF THE INVENTION

This invention relates to a semiconductor test system having a large number of contactors for establishing electrical connection with a semiconductor device under test, and more particularly, to a probe contact system having a planarity adjustment mechanism for adjusting distances between tips of the contactors and surfaces of contact targets such as contact pads of the semiconductor wafer under test.

BACKGROUND OF THE INVENTION

In testing high density and high speed electrical devices such as LSI and VLSI circuits, a high performance contact structure provided on a probe card must be used. A contact structure is basically formed of a contact substrate having a large number of contactors or probe elements. The contact substrate is mounted on a probe card for testing LSI and VLSI chips, semiconductor wafers, burn-in of semiconductor wafers and dice, testing and burn-in of packaged semiconductor devices, printed circuit boards and the like. The present invention is directed to a probe contact system including such a contact structure.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly or not.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A pogo-pi block (test fixture) 130 is mounted on the performance board 120 to accurately determine the contact position relative to the substrate handler 400. The pogo-pin block 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the pogo-pin block 130. The contact pins 141 are also connected to the contact terminals 121 of the performance board 120 with the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

A large number of contactors must be used in this type of semiconductor wafer test, such as from several hundreds to several thousands. In such an arrangement, it is necessary to planarize the tips of the contactors so that all of the contactors contact the contact targets at substantially the same time and with the same pressure. If planarization is not achieved, some contactors establish electrical connections with corresponding contact targets while other contactors fail to establish electrical connections, which makes it impossible to accurately test the semiconductor wafer. To completely connect all of the contactors to the contact targets, the semiconductor wafer must be further pressed against the probe card. However, doing so may physically damage the semiconductor dies due to excessive pressure by contactors.

Furthermore, because of drastic increase in the processing speed of semiconductor chips, contact targets on the semiconductor wafers are becoming more concentrated. Therefore, such testing utilizes a probe card with a large number of probe contactors 190 to contact with contact targets such as circuit terminals or contact pads in the IC circuit on the semiconductor wafer 300 under test. This arrangement requires the probe card and the probe contact system to be able to carry a large number of electrical connections to the test head. Furthermore, because of the small pitch of the contactors, connection from the contactors must be fanned-out to fit to external structures such as a pogo-pin block or an IC package, the probe card needs to be free from physical obstructions.

U.S. Pat. No. 5,861,759 shows an automatic probe card planarization system to planarize a first plane defined by a plurality of contact points of a probe card relative to a second plane defined by a top surface of a semiconductor wafer supported on a prober. A camera is used to measure the height of at least three selected contact points on the probe card relative to the plane of wafer. Based on the measured values, the position of the first plane relative to the second plane is calculated.

With that information and the geometry of the prober and tester, the height variations necessary for the two height variable points are made to planarize the first plane relative to the second plane. This conventional technology requires a camera for visualizing the height of the contact points, resulting in increase in cost and decrease in reliability of the overall system.

U.S. Pat. No. 5,974,662 shows a method of planarizing tips of probe elements of a probe card assembly. The probe elements are mounted directly on a space transformer (contact substrate). It is so configured that the orientation of the space transformer, and thus the orientation of the probe elements, can be adjusted without changing the orientation of the probe card. In this method, an electrically conductive metal plate (virtual wafer) is provided in stead of the target semiconductor wafer as a reference plane. A cable and a computer are also provided in such a way that a computer display shows whether a conductive path is created or not for each probe tip with respect to the metal plate by, for example, white and black dots.

Based on the visual image on the display, the planarity of the probe tips is adjusted by rotating differential screws so that all of the probe tips make substantially simultaneous contact with the metal plate. Because this conventional technology uses a conductive metal plate to establish conductive path for all of probe elements, it requires an extra time to mount the metal plate and replace the same with the target semiconductor wafer. Further, because this method needs a computer and a display to illustrate the states of contact or non-contact of the probe element, an overall cost has to be increased.

U.S. application Ser. No. 09/583,837, which is submitted by the same assignee of the present application shows a planarity adjustment mechanism including a gap sensor for measuring a gap between the contact substrate mounted on a probe card and a target substrate such as a semiconductor wafer at predetermined locations of the contact substrate. The probe card is mounted on a probe card ring formed on a frame of a probe contact system. The planarity adjustment mechanism further includes a rotation adjustment device for adjusting connection members so that the gap between the prove card and the probe card ring is regulated, thereby adjusting the distances between the tips of the contactors and the contact target to be identical to one another.

In this technology, however, since the rotation adjustment device is specially made to engage with the nut of the connection member at the bottom opening thereof, it has a relatively large size. Further, the rotation adjustment device is used on the upper surface of the prove card, it takes up a relatively large space on the prove card. Moreover, the probe card needs to be sufficiently apart from the frame of the system so that the rotational adjustment device can be operated on the probe card without contacting the frame, thereby requiring extra spaces.

Under the circumstances, there is a need in the industry to incorporate a more simple and economical way in a probe contact system to adjust the planarity of the contactors with respect to the surface of the semiconductor wafer.

SUMMARY OF THE INVENTION

Therefore, it is an object of the present invention to provide a probe contact system having a planarity adjustment mechanism for adjusting distances between tips of contactors and a surface of a semiconductor device under test.

It is another object of the present invention to provide a probe contact system having a planarity adjustment mechanism and a contact structure mounted on a probe card wherein the contact structure is formed of a contact substrate and a large number of contactors mounted on the contact substrate.

It is a further object of the present invention to provide a probe contact system having a planarity adjustment mechanism for adjusting distances between a contact substrate and a semiconductor wafer under test so that all of contactors on the contact substrate contact the surface of the semiconductor wafer at the same time.

It is a further object of the present invention to provide a probe contact system having a planarity adjustment mechanism for adjusting distances between a contact substrate and a semiconductor wafer under test so that each contactor exerts an identical pressure against the surface of the semiconductor wafer when brought into contact with the semiconductor wafer.

It is a further object of the present invention to provide a probe contact system having a planarity adjustment mechanism for adjusting distances between a contact substrate and a semiconductor wafer under test wherein the adjustment mechanism does not obstruct other components of the substrate handler.

It is a further object of the present invention to provide a probe contact system having a planarity adjustment mechanism for adjusting distances between a contact substrate and a semiconductor wafer under test wherein the probe card has sufficient support and reinforcement to withstand the mechanical pressure during testing.

In the first embodiment of the present invention, a planarity adjustment mechanism is comprised of a contact substrate having a large number of contactors mounted thereon, a probe card for mounting the contact substrate for establishing electrical communication between the contactors and a test head of a semiconductor test system, means for fixedly mounting the contact substrate on the probe card, a stiffener made of rigid material for fixedly mounting and reinforcing the probe card, a probe card ring attached to a frame of the probe contact system for mechanically coupling the probe card to the frame, and a plurality of adjustment members for up/down moving the stiffener relative to the probe card ring at three or more locations on the probe card. Each of the adjustment screws is housed within a through hole formed on the stiffener.

Preferably, the planarity adjustment mechanism further includes flanges on the stiffener each having the through hole for mounting the adjustment member. Each of the three locations of the adjustment members in the through holes of the stiffener corresponds to a vertex of a regular triangle. The adjustment members for moving the probe card are configured by adjustment screws. The through hole on the stiffener has inner threads which engage outer threads of the adjustment screw.

The planarity adjustment mechanism further includes a gap sensor for measuring a gap between the contact substrate and a target substrate at a predetermined location on the contact substrate where the target substrate is a semiconductor wafer to be tested or a reference plate for adjusting the planarity. The gap sensor determines the gap between the contact substrate and the target substrate by measuring capacitance between the gap sensor and an opposing electrode. The reference plate is a metal, ceramic or alumina substrate having electrodes at positions opposite to the gap sensor.

Preferably, the planarity adjustment mechanism further includes a conductive elastomer provided between the contact substrate and the probe card for electrically connecting the contact substrate and the probe card. The planarity adjustment mechanism further includes a support frame provided between the contact substrate and the probe card for supporting the contact substrate and the conductive elastomer through a connection member. The conductive elastomer is comprised of a silicon rubber sheet and metal filaments running in a vertical direction so as to establish communication only in the vertical direction.

In the second embodiment, the planarity adjustment mechanism is comprised of a contact substrate having a large number of contactors mounted thereon, a probe card for mounting the contact substrate for establishing electrical communication between the contactors and a test head of a semiconductor test system, means for fixedly mounting the contact substrate on the probe card, a stiffener made of rigid material for fixedly mounting and reinforcing the probe card, a probe card ring attached to a frame of the probe contact system for mechanically coupling the probe card to the frame, and a plurality of piezoelectric adjustment elements for up/down movements of the stiffener at three or more locations on the probe card in response to electrical signals provided thereto. Each of the piezoelectric adjustment elements is housed within a recess of the stiffener.

In a further aspect, the planarity adjustment mechanism further includes a controller for generating a control signal based on a detection signal from the gap sensor indicating a size of the gap between the contact substrate and the target substrate, wherein the control signal is sent to the piezoelectric adjustment element, thereby automatically controlling the gap between the contact substrate and the target substrate.

According to the present invention, the probe contact system is capable of adjusting the distances between tips of contactors and the surface of the semiconductor wafer under test or the reference plate. The planarity adjustment mechanism is capable of adjusting the distances between the contact substrate and the semiconductor wafer so that all of contactors on the contact substrate contact the surface of the semiconductor wafer at substantially the same time with substantially the same pressure.

The planarity adjustment mechanism for use with the probe contact system incorporates the stiffener to structurally support and strengthen the probe card so that any mechanical pressure applied upon the probe card would not deform or in anyway damage probe card. Furthermore, because the stiffener provided for the planarity adjustment mechanism of the present invention houses the adjustment members such as the adjustment screws or piezoelectric adjustment elements within small ares of the flanges. Thus, it does not physically obstruct the surroundings of the probe card or occupy any area of the probe card. Moreover, the planarity adjustment mechanism of the present invention can be configured as an automatic system by incorporating a controller generating control signals to the piezoelectric adjustment units based on the gaps measured by the gap sensors.

BRIEF DESCRIPTION OF THE INVENTION

DETAILED DESCRIPTION OF THE INVENTION

Figure 1:
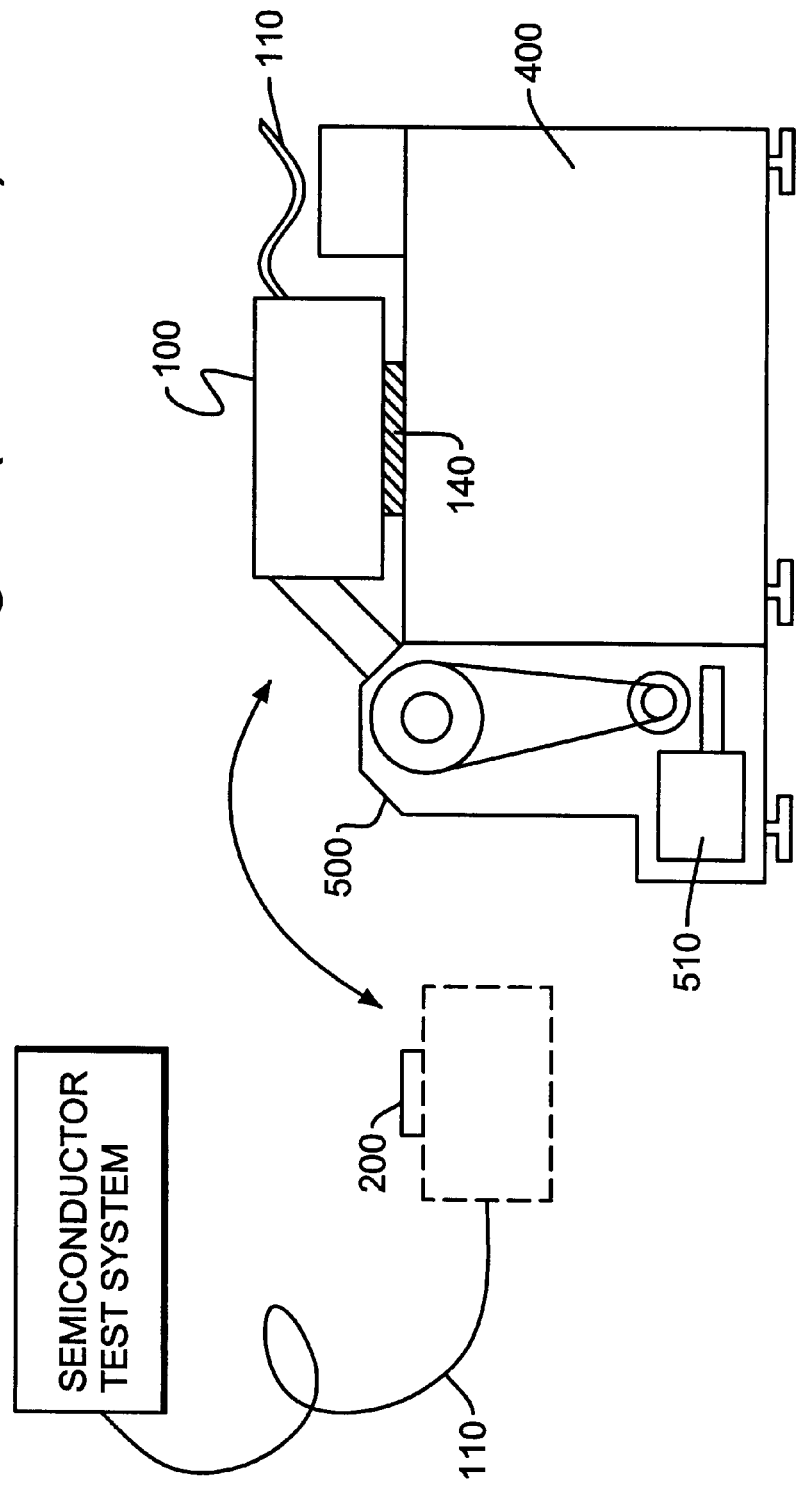
FIG. 1 is a schematic diagram showing a structural relationship between a substrate handler and a semiconductor test system having a test head.

An example of contact structure to be used in the probe contact system of the present invention will be described with reference to FIGS. 3 and 4. Many other different types of contact structures are also feasible in the probe contact system of the present invention. A contact structure 10 of FIG. 3 has beam like (silicon finger) contactors 30 produced through a microfabrication technology such as a semiconductor production process.

The contact structure 10 is basically formed of a contact substrate (space transformer) 20 and the contactors 30. The contact substrate 20 functions as a substrate to mount the contactors 30 thereon as well as a space transformer to change the space (fan-out) of the contactors 30. The contact structure 10 is so positioned over contact targets such as contact pads 320 on a semiconductor wafer 300 to be tested that the contactors 30 establish electric communication with the semiconductor wafer 300 when pressed with each other. Although only two contactors 30 are shown in FIG. 3, a large number, such as from several hundreds to several thousands, of contactors 30 are aligned on the contact substrate 20 in actual applications such as semiconductor wafer testing.

Such a large number of contactors are produced through the same semiconductor production process such as a photolithography process on a silicon substrate as the semiconductor wafer 300 to be tested and mounted on the contact substrate 20 made, for example of ceramic, silicon, alumina, glass fibers or other material. The pitch between the contact pads 320 may be as small as 50 $\mu$m or less wherein the contactors 30 on the contact substrate 20 can easily be aligned in the same pitch since they are made through the same semiconductor production process as the semiconductor wafer 300 are made.

Figure 2:
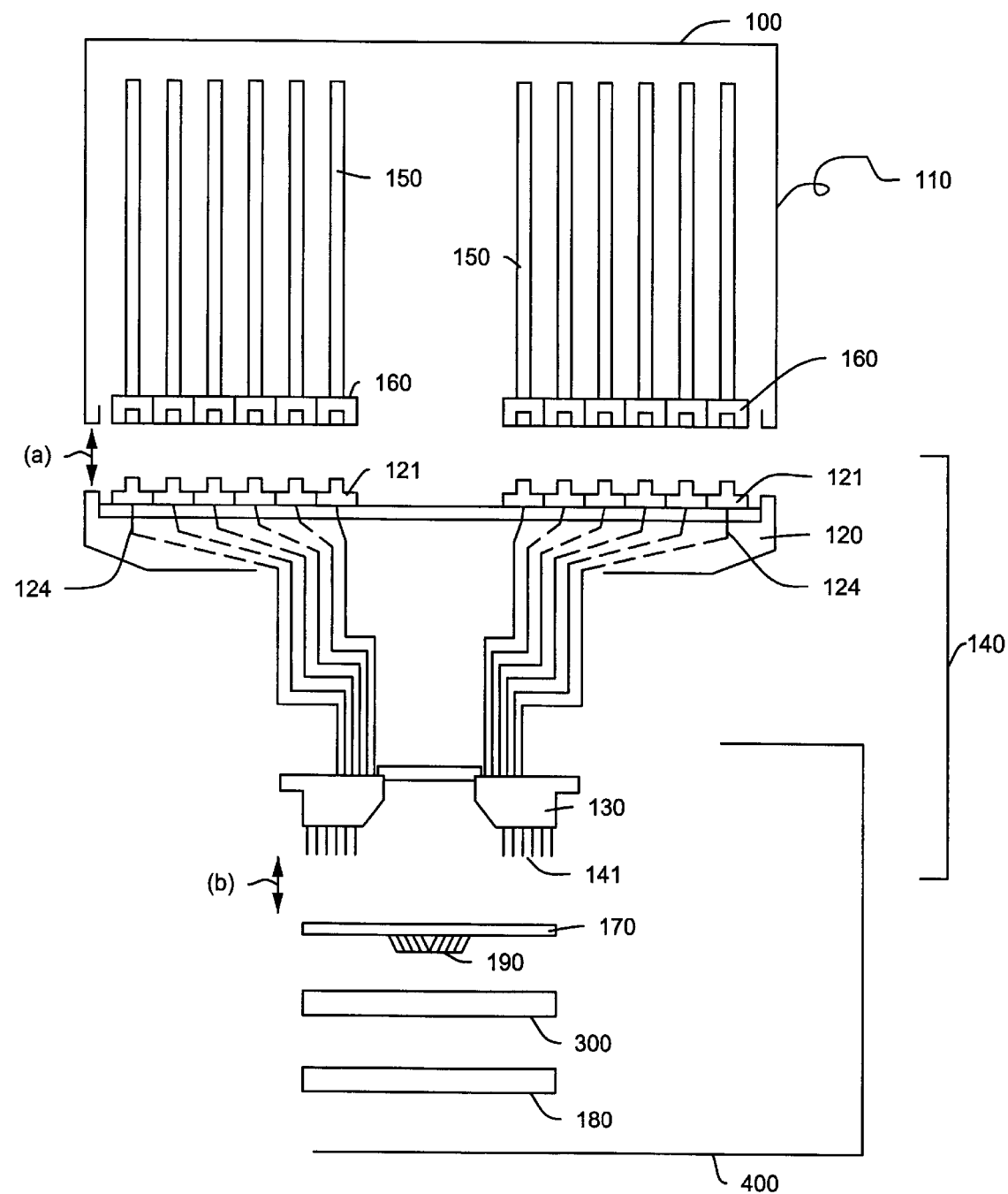
FIG. 2 is a diagram showing an example of detailed structure for connecting the test head of the semiconductor test system to the substrate handler.
Figure 3:
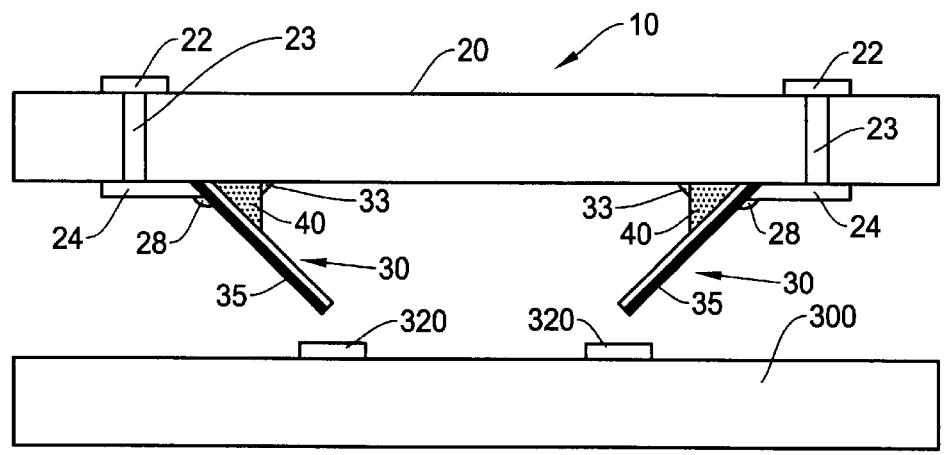
FIG. 3 is a cross sectional view showing an example of contact structure having beam like contactors to be mounted on a probe card of the probe contact system of the present invention.
Figure 4:
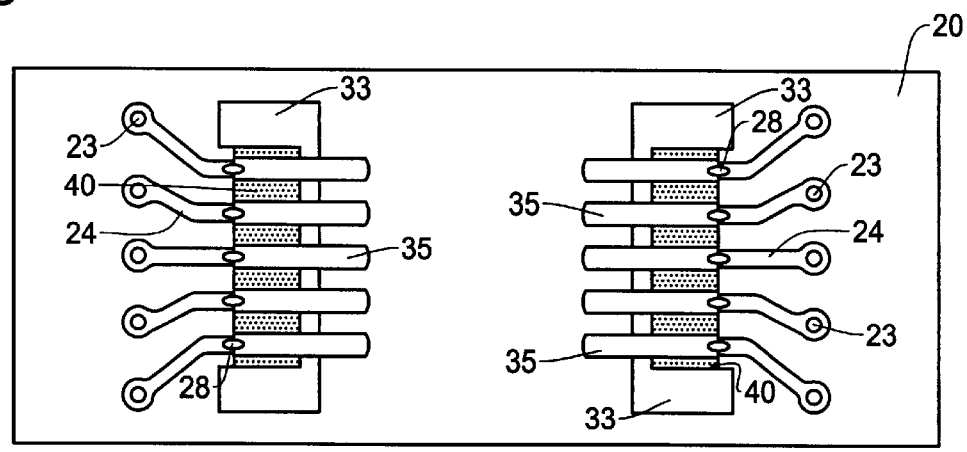
FIG. 4 is a schematic diagram showing a bottom view of the contact structure of FIG. 3 having a plurality of beam like contactors.

The beam like contactors 30 can be directly mounted on the contact substrate 20 as shown in FIGS. 3 and 4 to form a contact structure which can be mounted on the probe card 170 of FIG. 2. Since the contactors 30 can be fabricated in a very small size, an operable frequency range of a contact structure or probe card mounting the contactors of the present invention can be easily increased to 2 GHz or higher. Because of the small size, the number of contactors on a probe card can be increased to as many as, for example 2,000 or more, which is able to test as many as 32 or more memory devices in parallel at the same time.

In FIG. 3, each of the contactors 30 has a conductive layer 35 in a finger (beam) like shape. The contactor 30 also has a base 40 which is attached to the contact substrate 20. An interconnect trace 24 is connected to the conductive layer 35 at the bottom of the contact substrate 20. Such a connection between the interconnect trace 24 and the conductive layer 35 is made, for example, through a solder ball 28. The contact substrate 20 further includes a via hole 23 and an electrode 22. The electrode 22 is to interconnect the contact substrate 20 to an external structure such as a pogo-pin block or an IC package through a wire or a conductive elastomer.

Under this arrangement, when the semiconductor wafer 300 moves upward, the contactors 30 and the contact targets 320 on the wafer 300 mechanically and electrically contact with each other. Consequently, a signal path is established from the contact target 320 to the electrodes 22 on the contact substrate 20. The interconnect trace 24, the via hole 23 and the electrode 22 on the contact substrate (space transformer) 20 also function to fan-out the small pitch of the contactors 30 to a larger pitch to fit to the external structure such as a pogo-pin block or an IC package.

Because of the spring force of the beam like shape of the silicon finger contactors 30, the end of the conductive layer 35 produces a sufficient resilient contact force when the semiconductor wafer 300 is pressed against the contact substrate 20. The end of the conductive layer 35 is preferably sharpened to achieve a scrubbing effect when pressed against the contact target 320 for penetrating through a metal-oxide layer. For example, if the contact target 320 on the semiconductor wafer 300 has a metal-oxide layer such as formed with aluminum oxide on its surface, the scrubbing effect is necessary to establish an electrical connection the contact target 320 with low contact resistance. The spring force derived from the beam like shape of the contactor 30 provides an appropriate contact force against the contact target 320.

As in the foregoing, the spring force derived from the beam like shape of the contactor 30 provides an appropriate contact force against the contact target 320. The elasticity produced by the spring force of the contactor 30 also functions to compensate the differences in size or flatness (planarity) involved in the contact substrate 20, the contact target 320 and the wafer 300, as well as the contactors 30. However, to fully connect all of the contactors with the contact targets at substantially the same time with the same pressure, it is still necessary to incorporate the planarity adjustment mechanism of the present invention.

An example of material of the conductive layer 35 includes nickel, aluminum, copper, nickel palladium, rhodium, nickel gold, iridium or several other depositable materials. An example of size of the silicon finger contactor 30 intended for a semiconductor test application may be 100–500 $\mu$m in overall height, 100–600 $\mu$m in horizontal length, and about 30–50 $\mu$m in width for the pitch of 50 $\mu$m or more between contact targets 320.

FIG. 4 is a bottom view of the contact substrate 20 of FIG. 3 having a plurality of contactors 30. In an actual system, a larger number of contactors, such as several hundreds of them, will be aligned in the manner shown in FIG. 4. The interconnect traces 24 expand the pitch of the contactors 30 to the pitch of the via holes 23 and electrodes 22 as shown in FIG. 4. Adhesives 33 are provided at contact points (inner areas of contactors 30) between the substrate 20 and the bases 40 of the contactors 30. The adhesives 33 are also provided at appropriate locations of the contact structure.

Figure 5:
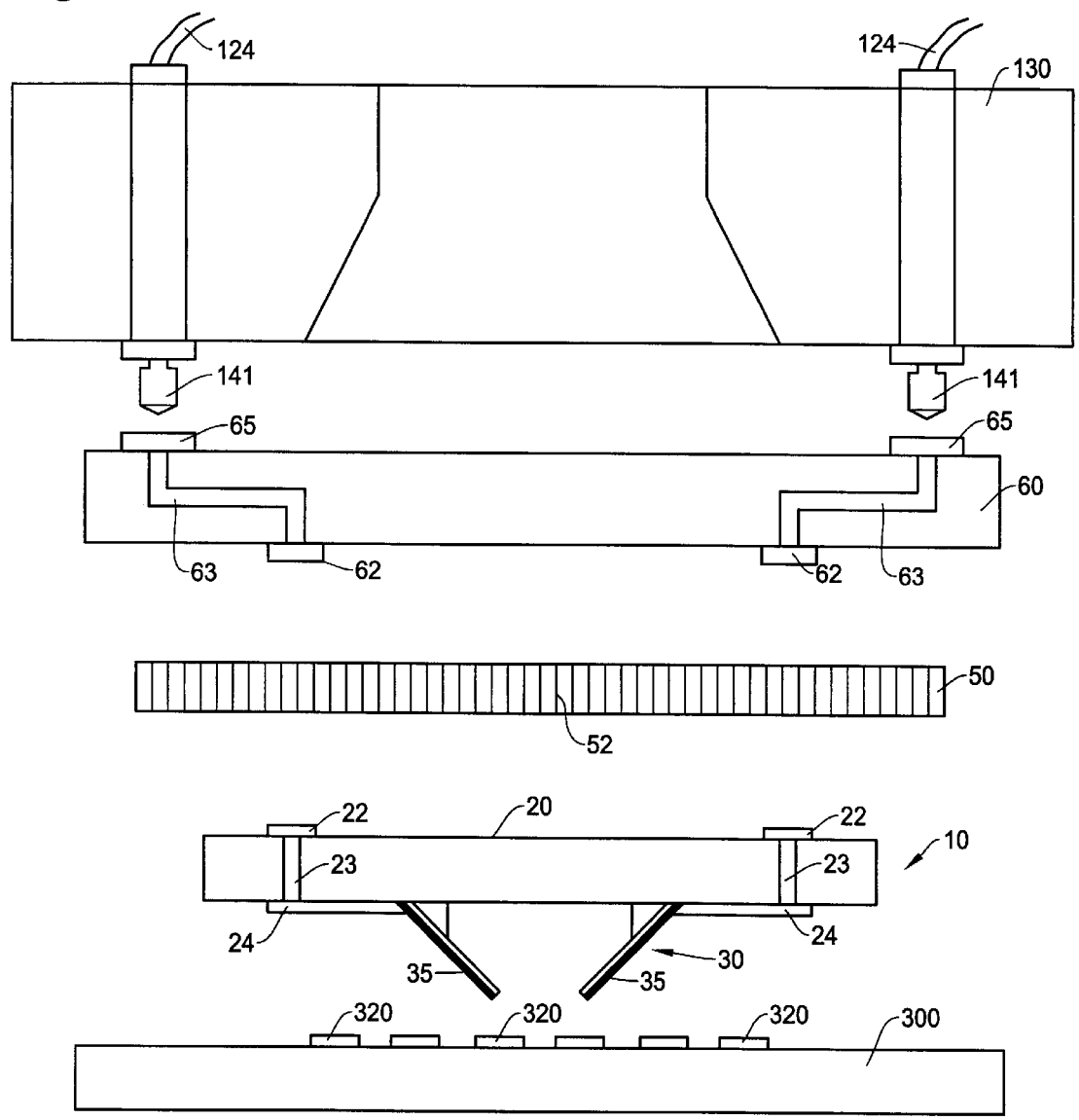
FIG. 5 is a cross sectional view showing an example of total stack-up structure in a probe contact system using the contact structure of FIGS. 3 and 4 as an interface between the semiconductor device under test and the test head of FIG. 2.

FIG. 5 is a cross sectional view showing an example of total stack-up structure forming a probe contact system using the contact structure of FIGS. 3 and 4. The probe contact system will be used as an interface between the semiconductor device under test and the test head of FIG. 2. In this example, the probe contact system includes a conductive elastomer 50, a probe card 60, and a pogo-pin block (test fixture) 130 provided over the contact structure 10 in the order shown in FIG. 5.

The conductive elastomer 50, probe card 60 and pogo-pin block 130 are mechanically as well as electrically connected with one another. Thus, electrical paths are created from the tips of the contactors 30 to the test head 100 through the cables 124 and performance board 120 (FIG. 2). Thus, when the semiconductor wafer 300 and the probe contact system are pressed with each other, electrical communication will be established between the device under test (contact pads 320 on the semiconductor wafer 300) and the semiconductor test system.

The pogo-pin block (test fixture) 130 is equivalent to the one shown in FIG. 2 having a large number of flexible pins such as pogo-pins to interface between the probe card 60 and the performance board 120. At upper ends of the pogo-pins, cables 124 such as coaxial cables are connected to transmits signals to printed circuit boards (pin electronics cards) 150 in the test head 100 in FIG. 2 through the performance board 120. The probe card 60 has a large number of contact pads or electrodes 62 and 65 on the upper and lower surfaces thereof. The electrodes 62 and 65 are connected through interconnect traces 63 to fan-out the pitch of the contact structure to meet the pitch of the pogo-pins in the pogo-pin block 130.

The conductive elastomer 50 is preferably provided between the contact structure 10 and the probe card 60. By its elasticity, the conductive elastomer 50 is to ensure electrical communications between the electrodes 22 of the contact structure and the electrodes 62 of the probe card by compensating unevenness or vertical gaps therebetween. The conductive elastomer 50 is an elastic sheet with unidirectional conductivity by having a large number of conductive wires in a vertical direction. For example, the conductive elastomer 50 is comprised of a silicon rubber sheet and a multiple rows of metal filaments. The metal filaments (wires) are provided in the direction perpendicular to the horizontal sheet of the conductive elastomer 50. An example of pitch between the metal filaments is 0.02 mm with thickness of the silicon rubber sheet is 0.2 mm. Such a conductive elastomer is produced by Shin-Etsu Polymer Co. Ltd and available in the market.

Figure 6:
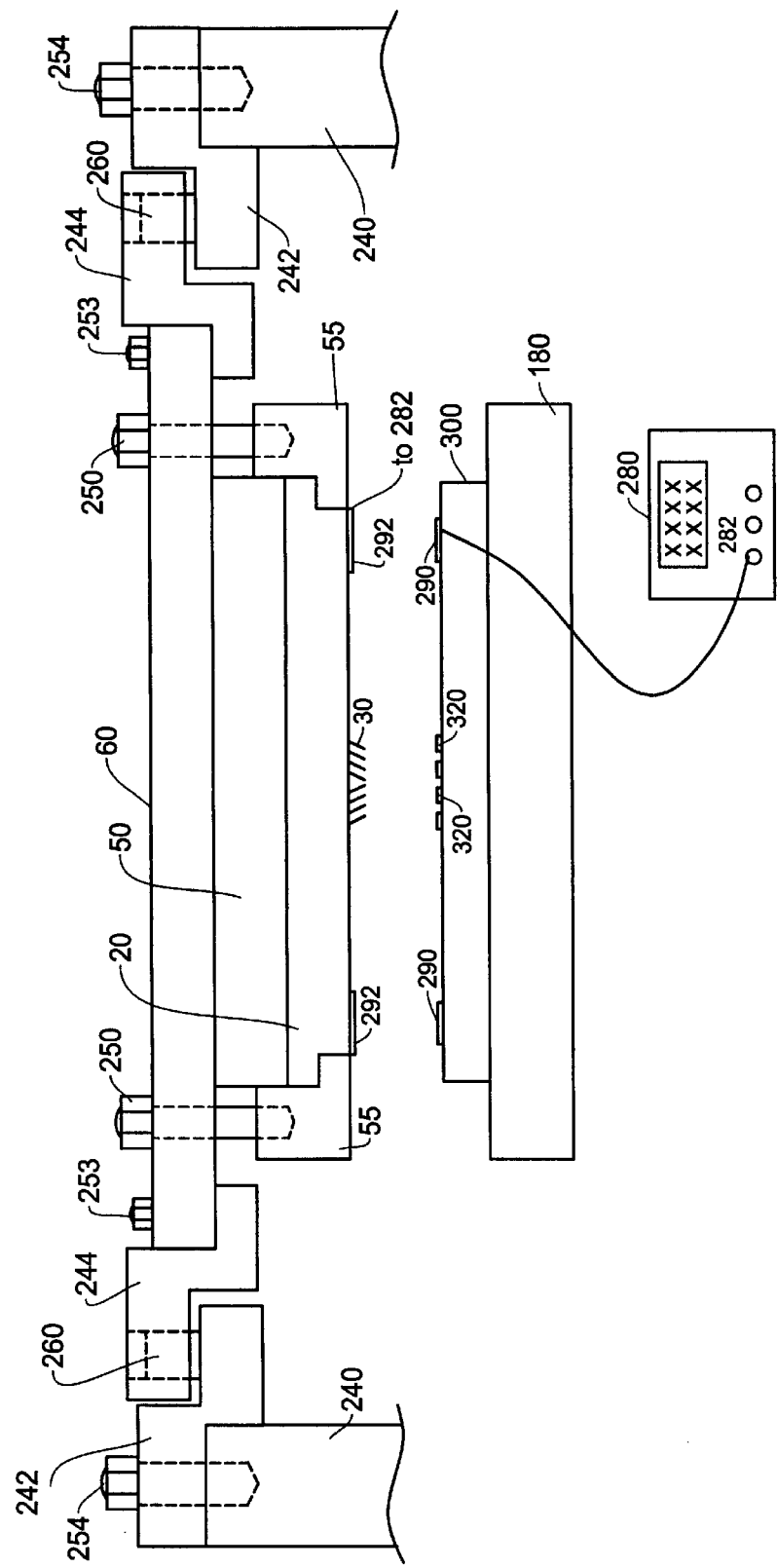
FIG. 6 is a cross sectional view showing an example of structure of a probe contact system having a planarity adjustment mechanism of the present invention.

FIG. 6 is a cross sectional view showing an example of structure of a probe contact system having a planarity adjustment mechanism of the present invention. The contact substrate (space transformer) 20 having a plurality of contactors 30 is mounted on the probe card 60 through a support frame 55 and a conductive elastomer 50. The support frame 55 for supporting the contact substrate 20 is fixedly connected to the probe card 60 by fastening means such as screws 250. Instead of the screws 250, various other fastening means are also feasible for fixedly connecting the probe card 60 and the contact substrate 20.

As described with reference to FIG. 5, the conductive elastomer 50 establishes electrical conductivity only in the vertical direction, i.e., between the contact substrate 20 and the probe card 60. The conductive elastomer 50 is preferable but can be replaced with other means for connecting the electrodes 22 on the upper surface of the contact substrate (space transformer) 20 and the electrodes 62 on the lower surface of the probe card 60.

On the bottom surface of the contact substrate 20, electrodes 292 are provided as a part of gap sensors. Alternatively, the electrodes 292 will be formed on the bottom surface of the support frame 55. The electrodes 292 are provided at three or more locations on the bottom surface of the contact substrate 20. Each location of the electrode 292 is preferably close to an edge of the contact substrate 20 in such a way to form vertexes of a triangular or polygonal shape.

The example of FIG. 6 further shows gap sensors 290 on the semiconductor wafer 300 and a gap measurement instrument 280 which receives signals from the gap sensors 290. The gap sensors 290 are also electrodes and are placed on the surface of the semiconductor wafer 300 at positions corresponding to the electrodes 292 on the bottom surface of the contact substrate (space transformer) 20, i.e, at three or more locations thereon. In this example, the gap sensor is configured by a pair of electrodes 290 and 292 forming a capacitor, i.e., a capacitive gap sensor.

The relationship between the gap sensor 290 and the electrodes 292 can be reversed. Namely, the gap sensor 290 can be provided on the bottom surface of the contact substrate and the electrode 292 can be provided on the upper surface of the semiconductor wafer 300. The semiconductor wafer 300 may include conductive pads on its surface which can be used as the electrodes 292. Further, a reference plate made of, for example, metal, ceramic or alumina may be used in lieu of the customer wafer 300 so that the planarity of the probe contact system is adjusted by a manufacturer prior to the shipment to customers.

The example of FIG. 6 further shows the probe card 60 attached to a stiffener 244. The stiffener 244 is a ring shaped member made of rigid material such as steel and is mounted on a frame 240 of the probe contact system through a probe card ring 242. The probe card ring 242 is connected to the frame 240 by fastening means such as screws 254. Alternatively, the probe card ring 242 is integrally formed with the frame 240 of the system.

The probe card 60 and the stiffener 244 are also connected through fastening means such as screws (not shown). The stiffener 244 is mounted on the probe card ring 242 through an adjustment member such as adjustment screws 260. The adjustment screws 260 are provided in the screw holes of the stiffener 244 for adjusting the gaps between the stiffener 244 and the probe card ring 242. This arrangement is an essential portion of the planarity adjustment mechanism in the first embodiment of the present invention.

Figure 7:
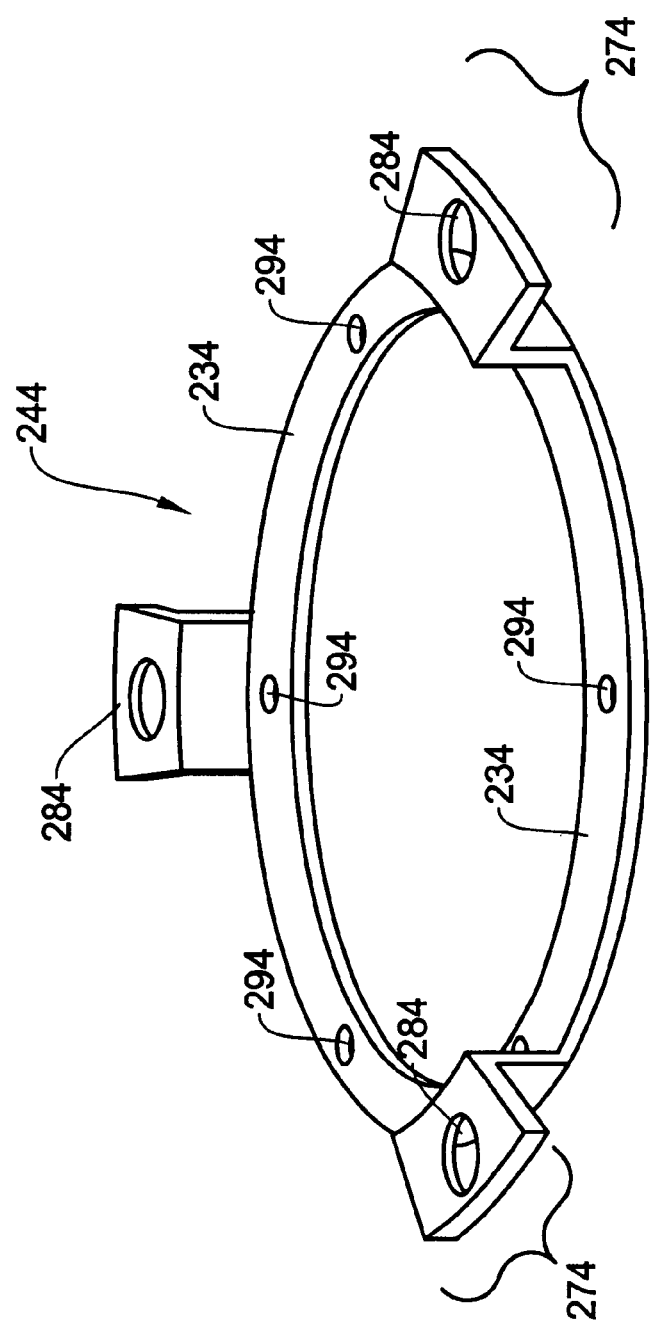
FIG. 7 is a perspective view showing an example of the stiffener used in the planarity adjustment mechanism of the present invention shown in FIG. 6.

The adjustment screws 260 are provided at three or more locations of the stiffener 244 at flange like portions thereof (flanges 274 in FIG. 7). Each location of the adjustment screw 260 is at an outer edge of the stiffener 244 on the flange 274 in such a way to form vertexes of a triangular or polygonal shape. As will be described later, the adjustment screw 260 has outer threads which meet the inner threads of the flange 274 on the stiffener 244.

A semiconductor wafer 300 to be tested is placed on a chuck 180 of the substrate handler 400 (FIG. 1) such as a wafer prober. Although not shown, it is known in the art that the frame 240 of the probe contact system and the housing of the substrate handler are mechanically connected with each other. Thus, in this arrangement, the angle or inclination of the probe card 60 and the contact substrate 20 is adjusted relative to the probe card ring 242 (or frame 240 of the probe contact system), thereby adjusting the planarity of the tips of the contactors 30.

The rotation of the adjustment screws 260 causes vertical movements of the stiffener 244, thereby changing the gap between the stiffener 244 and the probe card ring 242, and thus, the gap between the contact substrate (space transformer) 20 and the semiconductor wafer 300. In this arrangement, since the vertical positions of the edges (flanges 274) of the stiffener 244 are changed at three locations or more, the heights of the contactors 30 on the contact substrate 20 are accordingly adjusted to be identical relative to the surface of the semiconductor wafer 300. In other words, since the probe card 60 and the contact substrate 20 are fixedly attached to each other, and the probe card 60 and the stiffener 244 are fixedly attached to each other, the planarity of the contactors 30 are adjusted by changing the inclination (orientation) of the stiffener 244 relative to the probe card ring 242.

As an example, the gap sensor 290 is a capacitance sensor to measure capacitance between the sensor (electrode) 290 and the opposite electrode 292. The measured capacitance value is a function of the distance between the two electrodes. An example of such a gap sensor is a model HPT-500-V offered by Capacitec, Inc., 87 Fichburg Road, Ayer, Mass. By monitoring the gap size between the sensor 290 and the electrode 292 measured by the gap measurement instrument 280, an operator rotates the adjustment screws 260 in such a way that the gap at each of three or more locations becomes identical to one another.

FIG. 7 is a perspective view showing the structure of the stiffener 244 used in the planarity adjustment mechanism of the present invention. The stiffener 244 functions as a structural support for the probe card 60 in that the probe card support ring 234 fixedly mounts the probe card 60 so that the probe card 60 can withstand the physical pressure applied during testing. Namely, the stiffener 244 makes the probe card 60 rigid enough without using a conventional support plate. Also, the stiffener 244 provides an attachment structure for the adjustment screws 260 noted above at three or more flanges 274.

Figure 10:
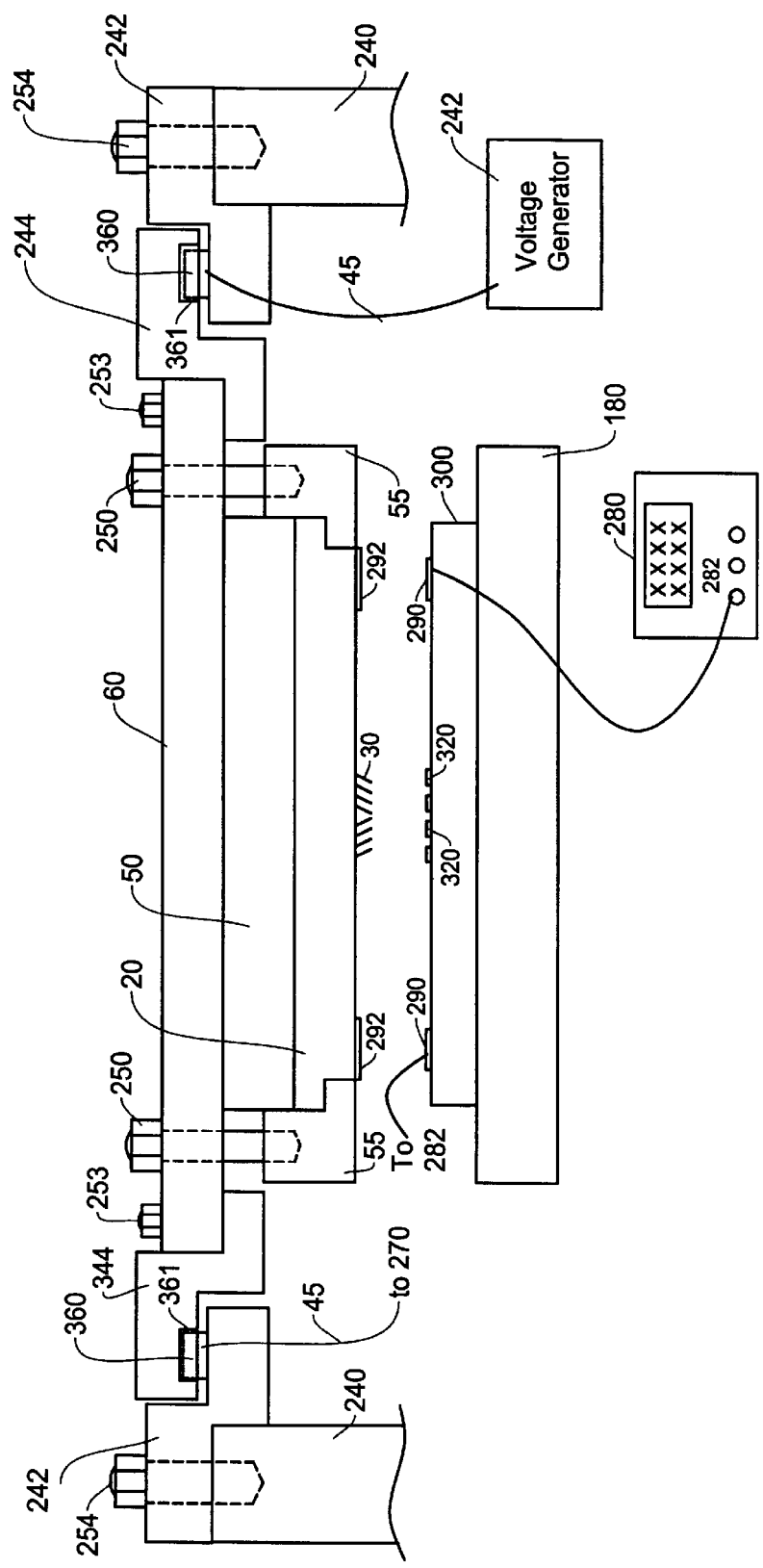
FIG. 10 is a cross sectional view showing another example of structure of a probe contact system having a planarity adjustment mechanism of the present invention.

The stiffener 244 is made of rigid metal throughout, such as steel, to sufficiently support the probe card 60 and to establish sufficient stiffness of the probe card 60 so that the probe card will not be deformed or in anyway damaged. The stiffener 244 of the present invention is comprised of three of more flanges 274, adjustment member receivers 284 such as screw holes, probe card fastening holes 294, and a probe card support ring 234. Adjustment receiver 284 receives the adjustment mechanisms such as adjustment screws 260 or piezoelectric adjustment element 360 (FIG. 10). Probe card 60 is attached to the stiffener 244 through fastening means such as screws 253 (FIG. 6) and the probe card fastening holes 294.

Figure 8:
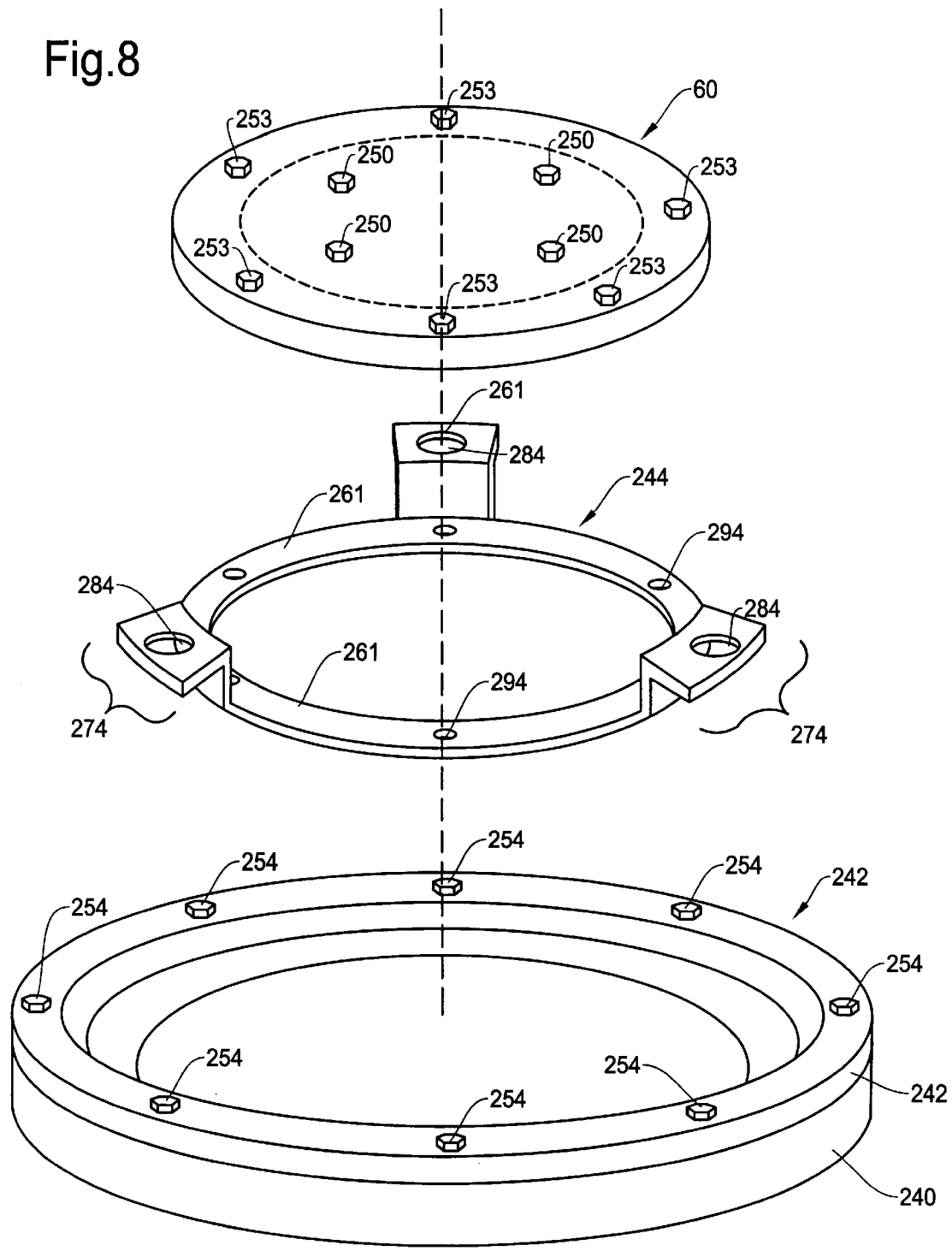
FIGS. 8 is an exploded view showing the structural relationship among the frame, probe card ring, and the probe card, incorporating the stiffener and the planarity adjustment mechanism of the present invention.

FIG. 8 is an exploded view showing the structural relationship among the probe card 60, the stiffener 244 and the probe card ring 242. As can be seen in the drawing, the frame 240 and the probe card ring 242 are attached to each other through the screws 254. Alternatively, the probe card ring 242 and the system frame 240 are integral with one another. The probe card 60 is fixedly mounted on the stiffener 244 by the screws 253 and screw holes 294. As noted above, since the stiffener 244 is made of hard, rigid material, the probe card 60 is reinforced and has sufficient stiffness.

The stiffener 244 mounting the probe card 60 is placed on the probe card ring 242 so that it is housed in the inner are of the probe card ring 242. As shown in FIG. 6, the adjustment mechanism such as adjustment screw 260 supports the stiffener 244 on the probe card ring 242 at each of the flanges 274. The adjustment screw 260 has the outer threads which engage the inner threads of the screw hole 284. Thus, by the rotation of the adjustment screws 260, the vertical positions of the stiffener 244 at the flanges 274 change accordingly.

Figure 9:
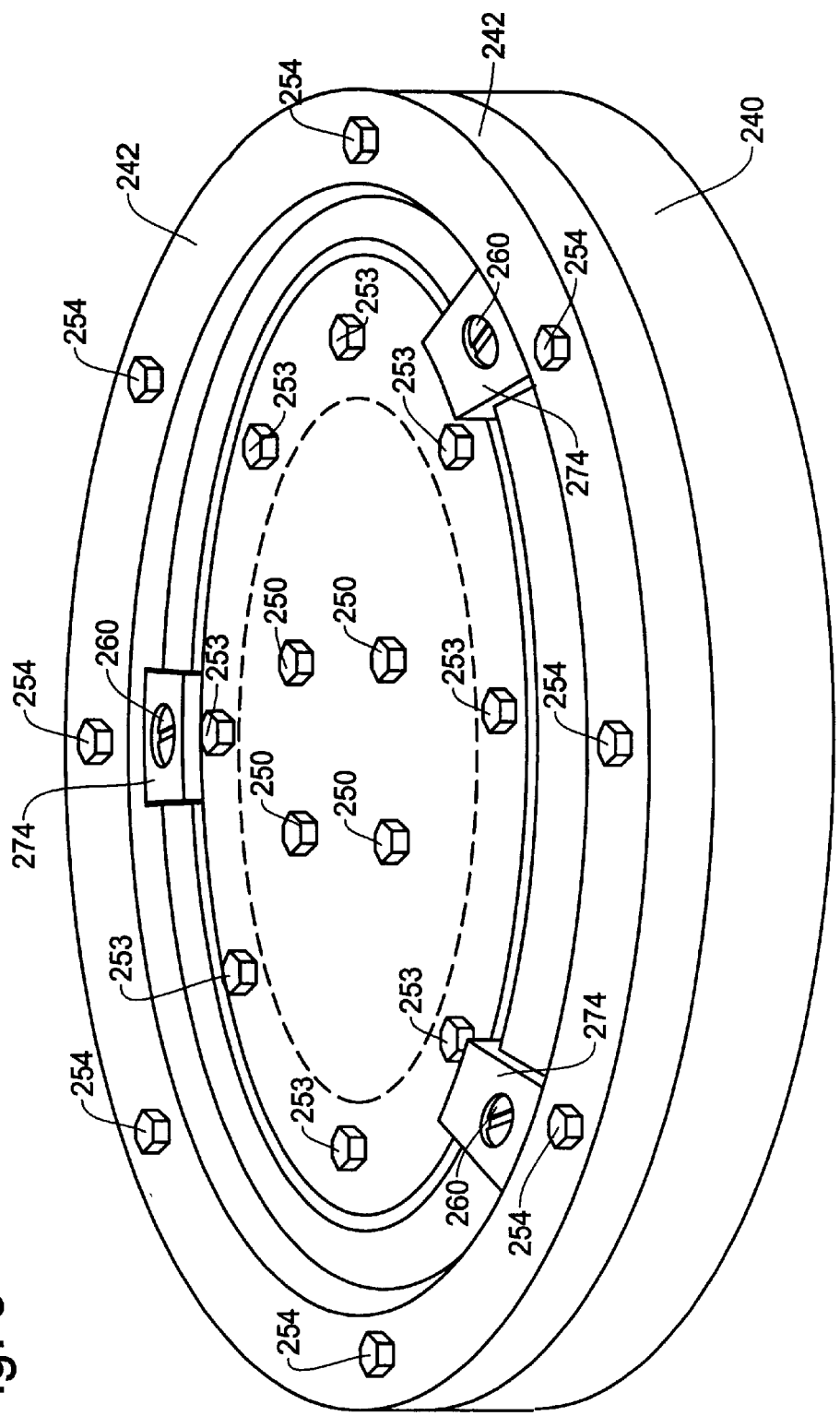
FIG. 9 is a perspective view showing the upper surfaces of the probe card, stiffener, and the probe card ring used in the probe contact system of FIGS. 6–8.

FIG. 9 is a perspective view showing upper surfaces of the probe card 60, the stiffener 244, and the probe card ring 242 used in the probe contact system of FIGS. 6–8. As can be seen, the adjustment screws 260 for the planarity adjustment are provided at least three locations of the outer edge of the stiffener 244. Such positions of the adjustment screws 260 preferably correspond to vertexes of a regular triangle. The stiffener 244 is placed on the inner area of the probe card ring 242 through the adjustment screws 260 mounted on the flanges 274.

Because the planarity adjustment mechanism is formed within the flange 274 of the stiffener 244 and thus not requiring any space on the probe card or change in the circuit patterns or requiring any area on the probe card, it is able to full use of the probe card 60. Namely, the present invention is able to maintain the sufficient space of the probe card for all the wiring and circuit patterns and to fan-out the pitch to the pogo-pin blocks or other components in the test fixture of the semiconductor test system. FIG. 9 also shows the screws 253 which fixedly attach the probe card 60 to the stiffener 244.

FIG. 10 is a cross sectional view showing another example of structure of a probe contact system having a planarity adjustment mechanism of the present invention. The structure of this example is similar to the example of FIG. 6, thus, in FIG. 10, the same reference numbers are used for the elements identical to those shown in FIG. 6. In the example of FIG. 10, the major difference is that the adjustment screw 260 in FIG. 6 is replaced with a piezoelectric adjustment element 360. The piezoelectric adjustment element 360 is mounted at a bottom opening or recess 361 formed on the flange 274 of the stiffener 244.

As is well known in the art, the application of a mechanical stress produces in certain dielectric crystals an electric polarization which is proportional to this stress. The converse piezoelectric effect is a thermodynamic consequence of the direct piezoelectric effect. When a polarization is induced in a piezoelectric crystal by an externally applied electric field, the crystal suffers a small strain which is proportional to the electric field.

In the present invention, the converse piezoelectric effect expands or contracts the piezoelectric adjustment element 360 so that the probe card 60 on the stiffener 344 can be adjusted. More specifically, an electrical signal from a voltage generator 270 is applied to the piezoelectric adjustment element 360 through cables 45 so that the piezoelectric adjustment element 360 can move the stiffener 244 in the vertical direction at appropriate locations. As noted above, the expansion or contraction of the piezoelectric adjustment element 360 located at three or more locations causes the vertical movements of the stiffener 344. The vertical movements change the gap between the stiffener 344 and the probe card ring 242, and thus, between the contact substrate 20 mounted on the probe card 60 and the semiconductor wafer 300.

Figure 11:
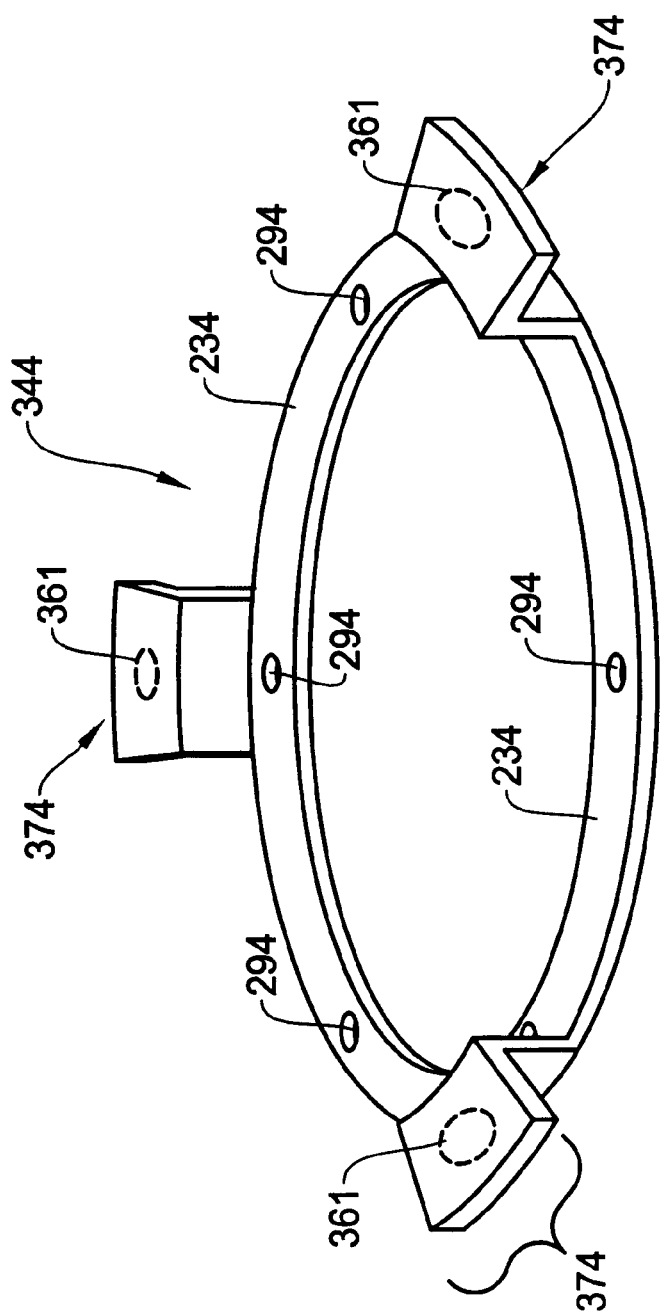
FIG. 11 is a perspective view showing an example of the stiffener used in the planarity adjustment mechanism of the present invention shown in FIG. 10.

FIG. 11 is a perspective view showing the structure of the stiffener 344 used in the planarity adjustment mechanism of the present invention. The stiffener 344 functions as a structural support for the probe card 60 in that the probe card support ring 234 fixedly mounts the probe card 60 so that the probe card 60 has sufficient stiffness and withstand the physical pressure applied during testing. The flange 374 has a bottom opening (recess) 361 to mount the piezoelectric adjustment element 360 therein. As shown in FIG. 10, the piezoelectric adjustment element 360 is provided with an electrical signal from the voltage generator 270. The piezoelectric adjustment element 360 expands or contracts in response to the amount of voltage of the electrical signal.

Figure 12:
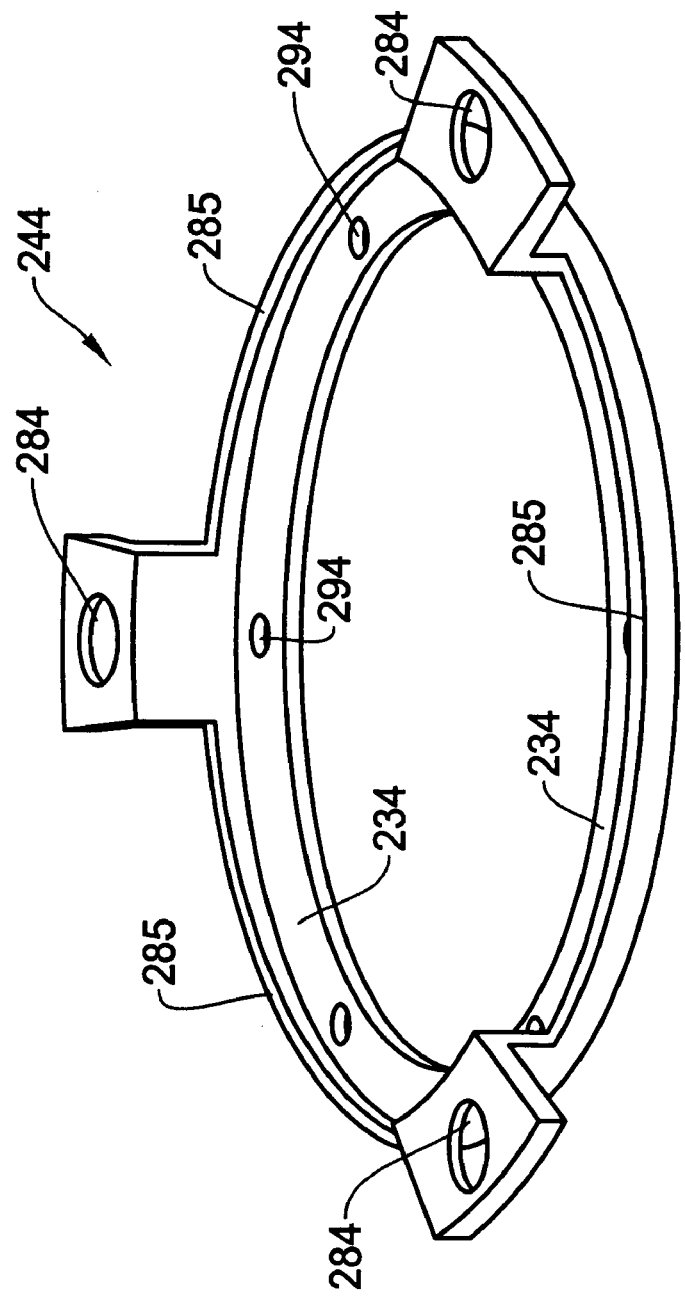
FIG. 12 is a perspective view showing another example of structure of the stiffener incorporated in the planarity adjustment mechanism of the present invention.

FIG. 12 is a perspective view showing another example of structure of the stiffener of the present invention. The stiffener 244 of FIG. 12 is substantially the same as that of FIG. 7 except that it further has a raised rim 285. The raised rim 285 of the stiffener 244 in this example improves the mechanical strength of the stiffener 244 as well as the probe card 60 when the probe card 60 is secured within the stiffener 244. The raised rim 285 gives the connection between the outer edge of the probe card 60 and the stiffener 244, thereby increasing the mechanical strength and stability of the probe card 60.

Figure 13:
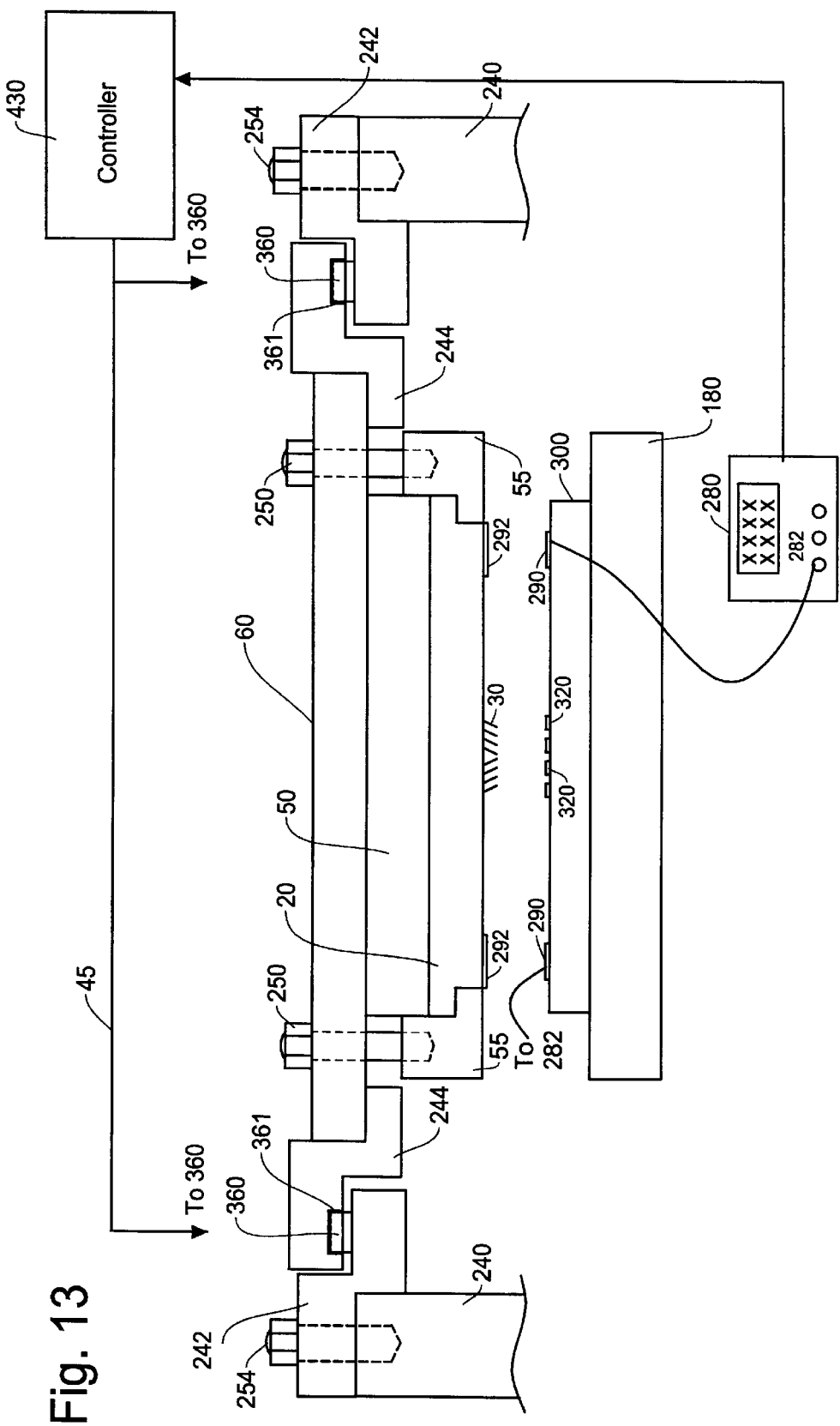
FIG. 13 is a cross sectional view showing a further example of probe contact system having the planarity adjustment mechanism of the present invention.

FIG. 13 shows a further example of the probe contact system having a planarity adjustment mechanism of the present invention. In this example, the planarity adjustment mechanism is an automatic system for adjusting distances between the contact substrate and the semiconductor wafer or reference plate. In this example, cables (wires) 45 that send electrical signals to the piezoelectric adjustment elements 360 are also connected to a controller 430. The controller 430 produces the control signals by calculating the measured gaps from the gap measurement instrument 280. The appropriate electrical signals either expand or contract the piezoelectric adjustment elements 360 at appropriate locations so the adjustment can be performed automatically.

In the foregoing description of the present invention, although the probe card ring 242 and the stiffener 244, 344 are circularly shaped, these members can have any shape such as a square frame. What is necessary for these members is to couple between the probe card 60 and the housing or frame of the probe contact system or substrate handler such as a wafer prober.

As described in the foregoing, according to the present invention, the probe contact system is capable of adjusting the distances between tips of contactors and the surface of the semiconductor wafer under test or the reference plate. The planarity adjustment mechanism is capable of adjusting the distances between the contact substrate and the semiconductor wafer so that all of contactors on the contact substrate contact the surface of the semiconductor wafer at substantially the same time with substantially the same pressure.

The planarity adjustment mechanism for use with the probe contact system incorporates the stiffener to structurally support and strengthen the probe card so that any mechanical pressure applied upon the probe card would not deform or in anyway damage probe card. Furthermore, because the stiffener provided for the planarity adjustment mechanism of the present invention houses the adjustment members such as the adjustment screws or piezoelectric adjustment elements within small ares of the flanges. Thus, it does not physically obstruct the surroundings of the probe card or occupy any area of the probe card. Moreover, the planarity adjustment mechanism of the present invention can be configured as an automatic system by incorporating a controller generating control signals to the piezoelectric adjustment units based on the gaps measured by the gap sensors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A planarity adjustment mechanism for a probe contact system for establishing electrical connection with contact targets, comprising:
    a contact substrate having a large number of contactors thereon;
    a probe card for mounting the contact substrate for establishing electrical communication between the contactors and a test head of a semiconductor test system;
    means for fixedly mounting the contact substrate on the probe card;
    a stiffener made of rigid material for fixedly mounting and reinforcing the probe card;
    a probe card ring attached to a frame of a probe contact system for mechanically coupling the stiffener to the frame; and
    a plurality of adjustment members for up/down moving the stiffener relative to the probe card ring at three or more locations on the stiffener
    wherein each of the adjustment members is housed within a through hole formed on the stiffener.

2. A planarity adjustment mechanism for a probe contact system as defined in claim 1, wherein the stiffener has three or more flanges where the through hole is created for each flange for mounting the adjustment member.

3. A planarity adjustment mechanism for a probe contact system as defined in claim 1, further comprising a gap sensor for measuring a gap between the contact substrate and a target substrate at a predetermined location on the contact substrate where the target substrate is a semiconductor wafer to be tested or a reference plate for adjusting the planarity.

4. A planarity adjustment mechanism for a probe contact system as defined in claim 3, wherein the gap sensor determines the gap between the contact substrate and the target substrate by measuring capacitance between the gap sensor and an opposing electrode.

5. A planarity adjustment mechanism for a probe contact system as defined in claim 3, wherein the reference plate is a metal, ceramic or alumina substrate having electrodes at positions opposite to the gap sensor.

6. A planarity adjustment mechanism for a probe contact system as defined in claim 1, further comprising a conductive elastomer provided between the contact substrate and the probe card for electrically connecting the contact substrate and the probe card.

7. A planarity adjustment mechanism for a probe contact system as defined in claim 6, further comprising a support frame provided between the contact substrate and the probe card for supporting the contact substrate and the conductive elastomer through a connection member.

8. A planarity adjustment mechanism for a probe contact system as defined in claim 6, wherein the conductive elastomer is comprised of a silicon rubber sheet and metal filaments running in a vertical direction so as to establish communication only in the vertical direction.

9. A planarity adjustment mechanism for a probe contact system as defined in claim 1, wherein the adjustment members for moving the stiffener and probe card are configured by adjustment screws.

10. A planarity adjustment mechanism for a probe contact system as defined in claim 1, wherein the stiffener has three or more flanges where the through hole is created for each flange for mounting the adjustment member, and wherein the adjustment members for moving the probe card and stiffener are configured by adjustment screws, wherein the through hole has inner threads which engage outer threads of the adjustment screw.

11. A planarity adjustment mechanism for a probe contact system as defined in claim 1, wherein each of the three locations of the adjustment members on the stiffener corresponds to a vertex of a regular triangle.

12. A planarity adjustment mechanism for a probe contact system for establishing electrical connection with contact targets, comprising:
    a contact substrate having a large number of contactors mounted thereon;
    a probe card for mounting the contact substrate for establishing electrical communication between the contactors and a test head of a semiconductor test system;
    means for fixedly mounting the contact substrate on the probe card;
    a stiffener made of rigid material for fixedly mounting and reinforcing the probe card;
    a probe card ring attached to a frame of a probe contact system for mechanically coupling the probe card to the frame; and
    a plurality of piezoelectric adjustment elements for up/down movements of the stiffener relative to the probe card ring at three or more locations on the stiffener in response to electrical signals provided thereto;
    wherein each of the piezoelectric adjustment elements is housed within a recess formed on the stiffener.

13. A planarity adjustment mechanism for a probe contact system as defined in claim 12, wherein the stiffener has three or more flanges where the recess is created at the bottom of each flange for mounting the piezoelectric adjustment element.

14. A planarity adjustment mechanism for a probe contact system as defined in claim 12, further comprising a gap sensor for measuring a gap between the contact substrate and a target substrate at a predetermined location on the contact substrate where the target substrate is a semiconductor wafer to be tested or a reference plate for adjusting the planarity.

15. A planarity adjustment mechanism for a probe contact system as defined in claim 14, wherein the gap sensor determines the gap between the contact substrate and the target substrate by measuring capacitance between the gap sensor and an opposing electrode.

16. A planarity adjustment mechanism for a probe contact system as defined in claim 14, wherein the reference plate is a metal, ceramic or alumina substrate having electrodes at positions opposite to the gap sensor.

17. A planarity adjustment mechanism for a probe contact system as defined in claim 14, further comprising a controller for generating a control signal based on a detection signal from the gap sensor indicating a size of the gap between the contact substrate and the target substrate, wherein the control signal is sent to the piezoelectric adjustment element, thereby automatically controlling the gap between the contact substrate and the target substrate.

18. A planarity adjustment mechanism for a probe contact system as defined in claim 12, further comprising a conductive elastomer provided between the contact substrate and the probe card for electrically connecting the contact substrate and the probe card.

19. A planarity adjustment mechanism for a probe contact system as defined in claim 18, further comprising a support frame provided between the contact substrate and the probe card for supporting the contact substrate and the conductive elastomer through a connection member.

20. A planarity adjustment mechanism for a probe contact system as defined in claim 12, wherein each of the three locations of the piezoelectric adjustment members at the recess of the stiffener corresponds to a vertex of a regular triangle.

* * * * *